US006613395B2

(12) United States Patent
Affinito et al.

(10) Patent No.: US 6,613,395 B2
(45) Date of Patent: *Sep. 2, 2003

(54) METHOD OF MAKING MOLECULARLY DOPED COMPOSITE POLYMER MATERIAL

(75) Inventors: John D. Affinito, Tucson, AZ (US); Peter M. Martin, Kennewick, WA (US); Gordon L. Graff, West Richland, WA (US); Paul E. Burrows, Kennewick, WA (US); Mark E. Gross, Pasco, WA (US); Linda S. Sapochak, Henderson, NV (US)

(73) Assignee: Battelle Memorial Institute, Richland, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/835,505

(22) Filed: Apr. 16, 2001

(65) Prior Publication Data

US 2002/0122880 A1 Sep. 5, 2002

Related U.S. Application Data

(63) Continuation-in-part of application No. 09/212,926, filed on Dec. 16, 1998, now Pat. No. 6,228,436.

(51) Int. Cl.[7] ................................................. B05D 3/06
(52) U.S. Cl. ...................... 427/497; 427/551; 427/553; 427/562; 427/595; 427/255.6; 427/294; 427/398.1; 427/421
(58) Field of Search ............................... 427/497, 551, 427/553, 562, 595, 248.1, 255.6, 25.7, 294, 398.1, 421

(56) References Cited

U.S. PATENT DOCUMENTS 3,475,307 A 10/1969 Knox et al.
3,607,365 A 9/1971 Lindlof
4,098,965 A 7/1978 Kinsman (List continued on next page.)

FOREIGN PATENT DOCUMENTS

| BE | 704 297 | 2/1968 |
| DE | 19603746 | 4/1997 |
| EP | 0 299 753 | 1/1989 |

(List continued on next page.)

OTHER PUBLICATIONS

Affinito, J.D., et al., "Vacuum Deposition of Polymer Electrolytes on Flexible Substrates," "Proceedings of the Ninth International Conference on Vacuum Web Coating," Nov. 1995 ed R. Bakish, Bakish Press 1995, p. 20–36.

Vossen, J.L., et al., Thin Film Processes, Academic Press, 1978, Part II, Chapter 11–1, Glow Discharge Sputter Deposition, p. 12–63; Part IV, Chapter IV–1, Plasma Deposition of Inorganic Compounds and Chapter IV–2 Glow Discharge Polymerization, p. 335–397.

Penning, F.M., Electrical Discharges in Gasses, Gordon and Breach Science Publishers, 1965, Chapters 5–6, p. 19–35, and Chapter 8, p. 41–50.

(List continued on next page.)

Primary Examiner—Erma Cameron
(74) Attorney, Agent, or Firm—Killworth, Gottman, Hagan & Schaeff, LLP

(57) ABSTRACT

A method of making a composite polymer of a molecularly doped polymer. The method includes mixing a liquid polymer precursor with molecular dopant forming a molecularly doped polymer precursor mixture. The molecularly doped polymer precursor mixture is flash evaporated forming a composite vapor. The composite vapor is cryocondensed on a cool substrate forming a composite molecularly doped polymer precursor layer, and the cryocondensed composite molecularly doped polymer precursor layer is cross linked thereby forming a layer of the composite polymer layer of the molecularly doped polymer.

17 Claims, 3 Drawing Sheets

U.S. PATENT DOCUMENTS

| | | | |
|---|---|---|---|
| 4,283,482 A | 8/1981 | Hattori et al. | |
| 4,581,337 A | 4/1986 | Frey et al. | |
| 4,624,867 A | 11/1986 | Iijima et al. | |
| 4,695,618 A | 9/1987 | Mowrer | |
| 4,842,893 A | 6/1989 | Yializis et al. | |
| 4,954,371 A | 9/1990 | Yializis | |
| 5,032,461 A | 7/1991 | Shaw et al. | |
| 5,204,314 A | 4/1993 | Kirlin et al. | |
| 5,237,439 A | 8/1993 | Misono et al. | |
| 5,260,095 A | 11/1993 | Affinito | |
| 5,354,497 A | 10/1994 | Fukuchi et al. | |
| 5,395,644 A | 3/1995 | Affinito | |
| 5,427,638 A | 6/1995 | Goetz et al. | |
| 5,440,446 A | 8/1995 | Shaw et al. | |
| 5,536,323 A | 7/1996 | Kirlin et al. | |
| 5,547,508 A | 8/1996 | Affinito | |
| 5,554,220 A | 9/1996 | Forrest et al. | |
| 5,576,101 A | 11/1996 | Saitoh et al. | |
| 5,607,789 A | 3/1997 | Treger et al. | |
| 5,620,524 A | 4/1997 | Fan et al. | |
| 5,629,389 A | 5/1997 | Roitman et al. | |
| 5,652,192 A | 7/1997 | Matson et al. | |
| 5,654,084 A | 8/1997 | Egert | |
| 5,665,280 A | 9/1997 | Tropsha | |
| 5,681,615 A | 10/1997 | Affinito et al. | |
| 5,681,666 A | 10/1997 | Treger et al. | |
| 5,684,084 A | 11/1997 | Lewin et al. | |
| 5,686,360 A | 11/1997 | Harvey, III et al. | |
| 5,693,956 A | 12/1997 | Shi et al. | |
| 5,711,816 A | 1/1998 | Kirlin et al. | |
| 5,725,909 A | 3/1998 | Shaw et al. | |
| 5,731,661 A | 3/1998 | So et al. | |
| 5,747,182 A | 5/1998 | Friend et al. | |
| 5,757,126 A | 5/1998 | Harvey, III et al. | |
| 5,759,329 A | 6/1998 | Krause et al. | |
| 5,792,550 A | 8/1998 | Phillips et al. | |
| 5,811,177 A | 9/1998 | Shi et al. | |
| 5,811,183 A | 9/1998 | Shaw et al. | |
| 5,821,692 A | 10/1998 | Rogers et al. | |
| 5,844,363 A | 12/1998 | Gu et al. | |
| 5,872,355 A | 2/1999 | Hueschen | |
| 5,902,641 A | 5/1999 | Affinito et al. | |
| 5,902,688 A | 5/1999 | Antoniadis et al. | |
| 5,904,958 A | 5/1999 | Dick et al. | |
| 5,912,069 A | 6/1999 | Yializis et al. | |
| 5,919,328 A | 7/1999 | Tropsha et al. | |
| 5,922,161 A | 7/1999 | Wu et al. | |
| 5,945,174 A | 8/1999 | Shaw et al. | |
| 5,948,552 A | 9/1999 | Antoniadis et al. | |
| 5,955,161 A | 9/1999 | Tropsha | |
| 5,965,907 A | 10/1999 | Huang et al. | |
| 5,968,620 A | 10/1999 | Harvey et al. | |
| 5,996,498 A | 12/1999 | Lewis | |
| 6,013,337 A | 1/2000 | Knors | |
| 6,045,864 A | 4/2000 | Lyons et al. | |
| 6,083,628 A | 7/2000 | Yializis | |
| 6,092,269 A | 7/2000 | Yializis et al. | |
| 6,106,627 A | 8/2000 | Yializis | |
| 6,146,225 A | 11/2000 | Sheats et al. | |
| 6,165,566 A | 12/2000 | Tropsha | |
| 6,207,239 B1 * | 3/2001 | Affinito | 427/488 |
| 6,214,422 B1 | 4/2001 | Yializis | |
| 6,231,939 B1 | 5/2001 | Shaw et al. | |

FOREIGN PATENT DOCUMENTS

| | | |
|---|---|---|
| EP | 0 340 935 | 11/1989 |
| EP | 0 390 540 | 10/1990 |
| EP | 0 547 550 | 6/1993 |
| EP | 0 590 467 | 4/1994 |
| EP | 0 722 787 | 7/1996 |
| EP | 0 787 826 | 8/1997 |
| EP | 0 916 394 | 5/1999 |
| EP | 0 931 850 | 7/1999 |
| EP | 0 977 469 | 2/2000 |
| JP | 63136316 | 6/1988 |
| JP | 64-18441 | 1/1989 |
| JP | 2-183230 | 7/1990 |
| JP | 08325713 | 12/1996 |
| JP | 09059763 | 3/1997 |
| WO | WO 87 07848 | 12/1987 |
| WO | WO 95 10117 | 4/1995 |
| WO | WO 97 04885 | 2/1997 |
| WO | WO 97/22631 | 6/1997 |
| WO | WO 98 10116 | 3/1998 |
| WO | WO 98 18852 | 5/1998 |
| WO | WO 99 16557 | 4/1999 |
| WO | WO 99 16931 | 4/1999 |

OTHER PUBLICATIONS

Affinito, J.D., et al, "High Rate Vacuum Deposition of Polymer Electrolytes," Journal Vacuum Science Technology A 14(3), May/Jun. 1996.

Inoue et al., Fabrication of a Thin Film of MNA by Vapour Deposition, Proc. Jpn. Congr. Mater. Res., vol. 33, p. 177–9, 1990.

Affinito, J.D. et al., "PML/Oxide/PML Barrier Layer Performance Differences Arising From Use of UV or Electron Beam Polymerization of the PML Layers," Thin Solid Films, Elsevier Science S.A., vol. 308–309, Oct. 31, 1997, pp. 19–25.

Gustafsson, G. et al, "Flexible light–emitting diodes made from soluble conducting polymers," Nature, vol. 357, Jun. 11, 1992, pp. 447–479.

Affinito, J.D. et al., "Polymer–Oxide Transparent Barrier Layers," SVC 39th Annual Technical Conference, Vacuum Web Coating Session, 1996, pp. 392–397.

Affinito, J.D. et al, "PML/Oxide/PML Barrier Layer Performance Differences Arising From Use of UV or Electron Beam Polymerization of the PML Layers," SVC 40th Annual Technical Conference, 1997, pp. 19–25.

Wong, C.P., "Recent Advances in IC Passivation and Encapsulation: Process Techniques and Materials," Polymers for Electronic and Photonic Applications, AT&T Bell Laboratories, 1993, pp. 167–209.

Tropsha et al., "Activated Rate Theory Treatment of Oxygen and Water Transport through Silicon Oxide/Poly(ethylene terephthalate) Composite Barrier Structures," J. Phys. Chem B 1997, pp. 2259–2266.

Tropsha et al., "Combinatorial Barrier Effect of the Multilayer $SiO_x$ Coatings on Polymer Substrates," 1997 Society of Vacuum Coaters, 40th Annual Technical Conference Proceedings.

Phillips et al., "Evaporated Dielectric Colorless Films on PET and OPP Exhibiting High Barriers Toward Moisture and Oxygen," Society of Vacuum Coaters, 36th Annual Technical Conference Proceedings (1993), pp. 293–300.

Chahroudi, "Transparent Glass Barrier Coatings for Flexible Film Packaging," Society of Vacuum Coaters, 34th Annual Technical Conference Proceedings (1991), pp. 130–133.

Yamada et al., "The Properties of a New Transparent and Colorless Barrier Film," Society of Vacuum Coaters, 38th Annual Technical Conference Proceedings (1995), pp. 28–31.

Shi, M.K., et al., Plasma treatment of PET and acrylic coating surfaces–I. In situ XPS measurements, Journal of Adhesion Science and Technology, Mar. 2000, 14(12), pp. 1–28.

Shi, M.K., et al., In situ and real–time monitoring of plasma–induced etching PET and acrylic films, Plasmas and Polymers, Dec. 1999, 4(4), pp. 1–25.

Affinito, J.D., et al., Vacuum Deposited Conductive Polymer Films, The Eleventh International Conference on Vacuum Web Coating, no earlier than Feb. 1998, pp. 200–213.

Mahon, J.K., et al., Requirements of Flexible Substrates for Organic Light Emitting Devices in Flat Panel Display Applications, Society of Vacuum Coaters, 42nd Annual Technical Conference Proceedings, 1999, pp. 456–459.

Affinito, J.D. et al., "Molecularly Doped Polymer Composite Films for Light Emitting Polymer Applications Fabricated by the PML Process" 1998 Society of Vaccum Coaters, 41st Annual Technical Conference Proceedings (1998), pp. 220–225.

* cited by examiner

METHOD OF MAKING MOLECULARLY DOPED COMPOSITE POLYMER MATERIAL

BACKGROUND OF THE INVENTION

This application is a continuation-in-part of application Ser. No. 09/212,926, entitled "Method of Making Light Emitting Polymer Composite Material" filed Dec. 16, 1998, now U.S. Pat. No. 6,228,436.

The present invention relates generally to a method of making composite polymer films. More specifically, the present invention relates to making a composite polymer film from a mixture having molecular dopant in a liquid polymer precursor. Additional charge transport layers, or layers of polymer or metal may be added under vacuum as well.

As used herein, the term "polymer precursor" includes monomers, oligomers, and resins, and combinations thereof. As used herein, the term "monomer" is defined as a molecule of simple structure and low molecular weight that is capable of combining with a number of like or unlike molecules to form a polymer. Examples include, but are not limited to, simple acrylate molecules, for example, hexanedioldiacrylate, and tetraethyleneglycoldiacrylate, styrene, methyl styrene, and combinations thereof. The molecular weight of monomers is generally less than 1000, while for fluorinated monomers, it is generally less than 2000. Substructures such as $CH_3$, t-butyl, and CN can also be included. Monomers may be combined to form oligomers and resins, but do not combine to form other monomers.

As used herein, the term "oligomer" is defined as a compound molecule of at least two monomers that can be cured by radiation, such as ultraviolet, electron beam, or x-ray, glow discharge ionization, and spontaneous thermally induced curing. Oligomers include low molecular weight resins. Low molecular weight is defined herein as about 1000 to about 20,000 exclusive of fluorinated monomers. Oligomers are usually liquid or easily liquifiable. Oligomers do not combine to form monomers.

As used herein, the term "resin" is defined as a compound having a higher molecular weight (generally greater than 20,000) which is generally solid with no definite melting point. Examples include, but are not limited to, polystyrene resins, epoxy polyamine resins, phenolic resins, acrylic resins (for example, polymethylmethacrylate), and combinations thereof.

As used herein, the term "particle" is defined as a minute piece of matter, which can be as small as an atom or molecule or have a size up to ten micrometers.

As used herein, the term "(meth)acrylate" includes both acrylates and methacrylates, and "(meth)acrylic" includes both acrylic and methacrylic.

As used herein, the term "composite polymer" is defined as a polymer having one or more phases. If it has two phases, a first phase is substantially continuous and encompasses "islands" of a second phase from the molecular level to molecular aggregate level. The "islands" of the second phase may touch and/or the two phases may be unlinked or linked, but they do not provide a continuous conjugated network. As used herein, the term "conjugated" refers to a chemical structure of alternating single and double bonds between carbon atoms in a carbon atom chain. The composite polymer will have only one phase if the molecular dopant is soluble in the polymer precursor.

As used herein, the term "cryocondense" and forms thereof refer to the physical phenomenon of a phase change from a gas phase to a liquid phase upon the gas contacting a surface having a temperature lower than a dew point of the gas.

The basic process of plasma enhanced chemical vapor deposition (PECVD) is described in THIN FILM PROCESSES, J. L. Vossen, W. Kern, editors, Academic Press, 1978, Part IV, Chapter IV-1 Plasma Deposition of Inorganic Compounds, Chapter IV-2 Glow Discharge Polymerization, which is incorporated herein by reference. Briefly, a glow discharge plasma is generated on an electrode that may be smooth or have pointed projections. Traditionally, a gas inlet introduces high vapor pressure monomeric gases into the plasma region wherein radicals are formed so that upon subsequent collisions with the substrate, some of the radicals in the monomers chemically bond or cross link (cure) on the substrate. The high vapor pressure monomeric gases include gases of $CH_4$, $SiH_4$, $C_2H_6$, $C_2H_2$, or gases generated from high vapor pressure liquid, for example styrene (10 torr at 87.4° F. (30.8° C.)), hexane (100 torr at 60.4° F. (15.8° C.)), tetramethyldisiloxane (10 torr at 82.9° F. (28.3° C.)) and 1,3,-dichlorotetramethyldisiloxane (75 torr at 44.6° F. (7.0° C.)), and combinations thereof, that may be evaporated with mild controlled heating. Because these high vapor pressure monomeric gases do not readily cryocondense at ambient or elevated temperatures, deposition rates are low (a few tenths of micrometer/min maximum) relying on radicals chemically bonding to the surface of interest instead of cryocondensation. Remission due to etching of the surface of interest by the plasma competes with reactive deposition. Lower vapor pressure species have not been used in PECVD because heating the higher molecular weight monomers to a temperature sufficient to vaporize them generally causes a reaction prior to vaporization, or metering of the gas becomes difficult to control, either of which is inoperative.

The basic process of flash evaporation is described in U.S. Pat. No. 4,954,371, which is incorporated herein by reference. This basic process may also be referred to as polymer multi-layer (PML) flash evaporation. Briefly, a radiation polymerizable and/or cross linkable material is supplied at a temperature below a decomposition temperature and polymerization temperature of the material. The material is atomized to droplets having a droplet size ranging from about 1 to about 50 microns. An ultrasonic atomizer is generally used. The droplets are then flash vaporized, under vacuum, by contact with a heated surface above the boiling point of the material, but below the temperature which would cause pyrolysis. The vapor is cryocondensed on a substrate, then radiation polymerized or cross linked as a very thin polymer layer.

According to the state of the art of making plasma polymerized films, PECVD and flash evaporation or glow discharge plasma deposition and flash evaporation have not been used in combination. However, plasma treatment of a substrate using a glow discharge plasma generator with inorganic compounds has been used in combination with flash evaporation under a low pressure (vacuum) atmosphere as reported in J. D. Affinito, M. E. Gross, C. A. Coronado, and P. M. Martin, "Vacuum Deposition Of Polymer Electrolytes On Flexible Substrates," Proceedings of the Ninth International Conference on Vacuum Web Coating, November 1995, ed. R. Bakish, Bakish Press 1995, pg. 20–36, and as shown in FIG. 1a. In that system, the plasma generator 100 is used to etch the surface 102 of a moving substrate 104 in preparation to receive the monomeric gaseous output from the flash evaporation 106 that cryocondenses on the etched surface 102 and is then passed by a first curing station (not shown), for example, electron beam or ultraviolet radiation, to initiate cross linking and curing. The plasma generator 100 has a housing 108 with a gas inlet 110. The gas may be oxygen, nitrogen, water or an inert gas, for example argon, or combinations thereof. Internally, an electrode 112 that is smooth or having one or more pointed projections 114 produces a glow discharge and makes a plasma with the gas which etches the surface 102. The flash evaporator 106 has a housing 116, with a monomer inlet 118 and an atomizing nozzle 120, for example an ultrasonic atomizer. Flow through the nozzle 120 is atomized into particles or droplets 122 which strike the heated surface 124 whereupon the particles or droplets 122 are flash evaporated into a gas that flows past a series of baffles 126 (optional) to an outlet 128 and cryocondenses on the surface 102. Although other gas flow distribution arrangements have been used, it has been found that the baffles 126 provide adequate gas flow distribution or uniformity while permitting ease of scaling up to large surfaces 102. A curing station (not shown) is located downstream of the flash evaporator 106. The monomer may be a (meth)acrylate (FIG. 1b).

Organic light emitting polymers may be long chain conjugated polymers with molecular weights on the order of 1 dalton, or small molecules, for example, metal (8-quinolinolato) chelates, quinacridone derivatives, or triaryl amine derivatives. Fabrication of organic light emitting devices (OLED) with small molecules has been with (1) conventional electron beam or thermal evaporation or sublimation of a solid small molecule material from a crucible; (2) spin coating of the small molecule material suspended in a solution of solvent and a polymeric binder followed by removal of the solvent; and (3) spin coating as for (2) but with a polymeric electrolyte binder. The evaporation/sublimation methods produce a film that is substantially composed of the light emitting small molecule. These methods offer high deposition rates, and other advantages, but suffer from the disadvantage of the difficulty of evaporating the small molecule material without significant thermal degradation. In spin coating, the film produced is a composite of a molecularly doped polymer (MDP) wherein the small molecules are dispersed throughout either a polymer or electrolyte. However, it is difficult to control thickness within the few hundred angstrom range necessary to control turn-on voltage.

Therefore, there is a need for an improved method of making molecularly doped polymer (MDP).

SUMMARY OF THE INVENTION

The present invention satisfies this need by providing a method of making a composite polymer of a molecularly doped polymer. The method includes mixing a liquid polymer precursor with molecular dopant forming a molecularly doped polymer precursor mixture, flash evaporating the molecularly doped polymer precursor mixture forming a composite vapor, and cryocondensing the composite vapor on a cool substrate forming a cryocondensed composite molecularly doped polymer precursor layer and cross linking the cryocondensed composite molecularly doped polymer precursor layer thereby forming a layer of the composite polymer of the molecularly doped polymer.

The flash evaporating may be performed by supplying a continuous liquid flow of the molecularly doped polymer precursor mixture into a vacuum environment at a temperature below both the decomposition temperature and the polymerization temperature of the molecularly doped polymer precursor mixture, continuously atomizing the molecularly doped polymer precursor mixture into a continuous flow of droplets, and continuously vaporizing the droplets by continuously contacting the droplets on a heated surface having a temperature at or above a boiling point of the liquid polymer precursor and of the molecular dopant, but below a pyrolysis temperature, forming the composite vapor. The droplets typically range in size from about 1 micrometer to about 50 micrometers, but they could be smaller or larger.

Alternatively, the flash evaporating may be performed by supplying a continuous liquid flow of the molecularly doped polymer precursor mixture into a vacuum environment at a temperature below both the decomposition temperature and the polymerization temperature of the molecularly doped polymer precursor mixture, and continuously directly vaporizing the liquid flow of the molecularly doped polymer precursor mixture by continuously contacting the molecularly doped polymer precursor mixture on a heated surface having a temperature at or above a boiling point of the liquid polymer precursor and of the molecular dopant, but below a pyrolysis temperature, forming the composite vapor.

The molecular dopant may be soluble in the polymer precursor, insoluble in the polymer precursor, and partially soluble in the polymer precursor, and combinations thereof. If the dopant material is a liquid, it may be any type having a boiling point below the temperature of the heated surface in the flash evaporation process. Molecular dopants include, but are not limited to, organic solids, organic liquids, and combinations thereof. Organic solids include, but are not limited to, metal (8-quinolinolato) chelates, phenyl acetylene, triaryl amine derivatives, quinacridone derivatives, and combinations thereof. Organic liquids include, but are not limited to, substituted metal tris(N-R 8-quinolinolato) chelates, and substituted tertiary aromatic amines, and combinations thereof:

The molecular dopant may be sufficiently small with respect to particle density and liquid polymer precursor density and viscosity that the settling rate of the molecular dopant within the liquid polymer precursor is several times greater than the amount of time to transport a portion of the liquid molecularly doped polymer precursor mixture from a reservoir to the atomization nozzle. The molecular dopant may vary in size from a single molecule or atom to about 1 $\mu$m maximum. The maximum size should generally be less than the thickness of the particle layer in an OLED, i.e., about 1000 Angstroms.

The polymer precursors may be monomers, oligomers, and resins, and combinations thereof. Examples of monomers include, but are not limited to, (meth)acrylate molecules, for example, hexanedioldiacrylate, and tetraethyleneglycoldiacrylate, styrene, and methyl styrene, and combinations thereof. Oligomers, include, but are not limited to, polyethylene glycol diacrylate 200, polyethylene glycol diacrylate 400, and polyethylene glycol diacrylate 600, tripropyleneglycol diacrylate, tetraethylene glycol diacrylate, tripropylene glycol monoacrylate, and caprolactone acrylate, and combinations thereof. Resins include, but are not limited to, polystyrene resins, epoxy polyamine resins, phenolic resins, and (meth)acrylic resins, and combinations thereof.

The cross linking may be by radiation, including ultraviolet, electron beam, and x-ray, glow discharge ionization, and spontaneous thermal induced cross linking.

Organic optoelectronic devices can be made using crosslinked molecularly doped polymer layers. Organic optoelectronic devices include, but are not limited to, organic light emitting devices, liquid crystal displays, photo diodes, light modulators for telecommunications, wave guides, solar cells, and integrated optics. The organic optoelectronic device may include a first electrode, a hole transport layer, an active layer, an electron transport layer, and a second electrode. One or more of the hole transport layer, the active layer, and the electron transport layer, may be crosslinked molecularly doped polymer layers. The organic optoelectronic device optionally includes a charge injection layer, and a hole blocking layer. The first electrode may be a transparent conductive oxide, and the second electrode may be a metal cathode. Active layers include, but are not limited to, light emitting layers, light absorbing layers, and electric current generating layers.

When the hole transport layer is the molecularly doped polymer layer, the molecular dopant includes, but is not limited to, tertiary aromatic amines. When the active layer is the molecularly doped polymer layer, the molecular dopant includes, but is not limited to, metal (8-quinolinolato) chelates, quinacridone derivatives, and triaryl amine derivatives. When the electron transport layer is the molecularly doped polymer layer, the molecular dopant includes, but is not limited to, metal (8-quinolinolato) chelates.

Another aspect of the invention involves a method of making an organic optoelectronic device. The method includes depositing a first electrode adjacent a substrate, depositing a hole transport layer adjacent the first electrode, depositing an active layer adjacent the hole transport layer, depositing an electron transport layer adjacent the active layer, and depositing a second electrode adjacent the electron transport layer, wherein at least one of the layers selected from the group consisting of the hole transport layer, the active layer, and the electron transport layer, and combinations thereof, comprises a crosslinked molecularly doped polymer layer. Optionally, a charge injection layer can be deposited adjacent to the first electrode before the hole injection layer is deposited, and/or a hole blocking layer can be deposited adjacent to the electron transport layer before the second electrode is deposited. By adjacent, we mean next to, but not necessarily directly next to. There can be additional layers intervening between the adjacent layers.

The molecularly doped polymer layer can be made by mixing a liquid polymer precursor with molecular dopant forming a molecularly doped polymer precursor mixture, flash evaporating the molecularly doped polymer precursor mixture forming a composite vapor, and cryocondensing the composite vapor on a cool substrate forming a cryocondensed composite molecularly doped polymer precursor layer and cross linking the cryocondensed composite molecularly doped polymer precursor layer thereby forming a layer of the composite polymer of the molecularly doped polymer.

Accordingly, it is an object of the present invention to provide a method of making a composite polymer of a molecularly doped polymer.

DETAILED DESCRIPTION OF THE INVENTION

Figure 1A:
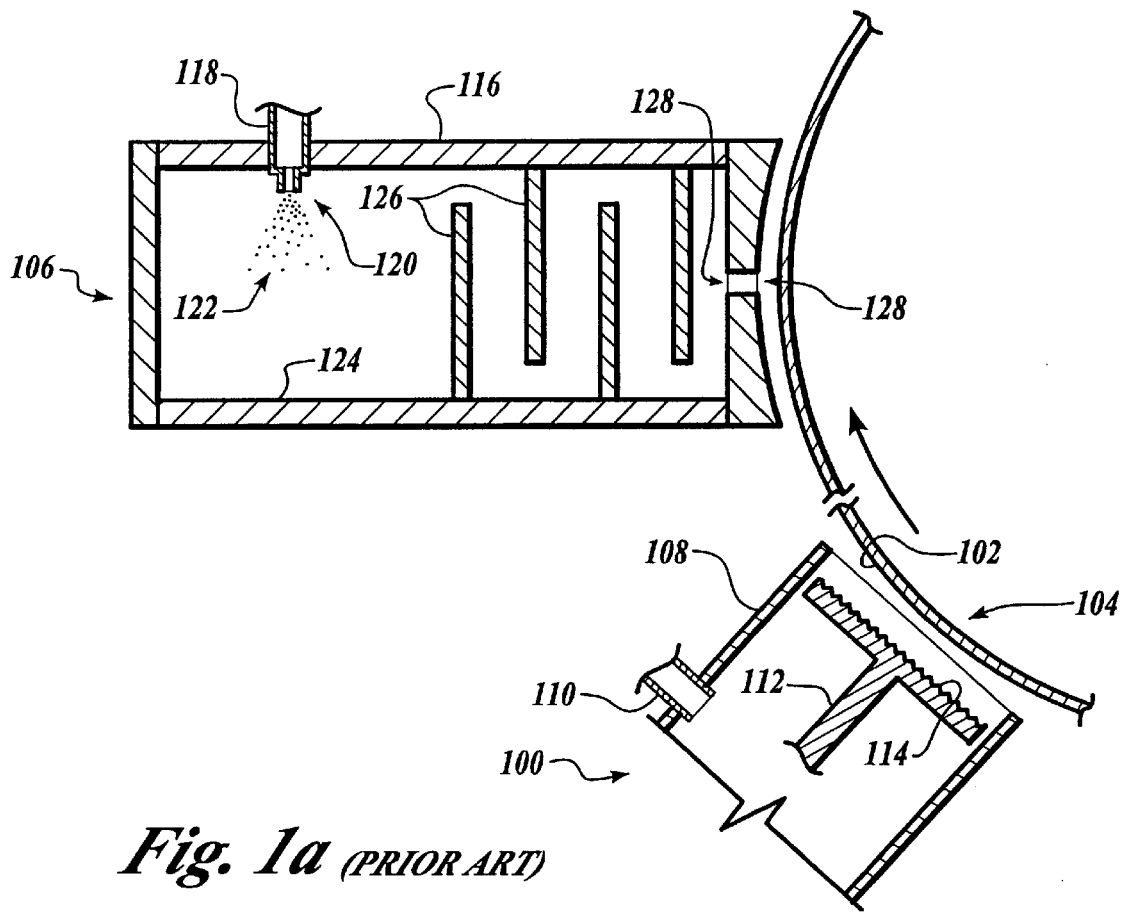
FIG. 1a is a cross section of a prior art combination of a glow discharge plasma generator with inorganic compounds with flash evaporation.
Figure 1B:
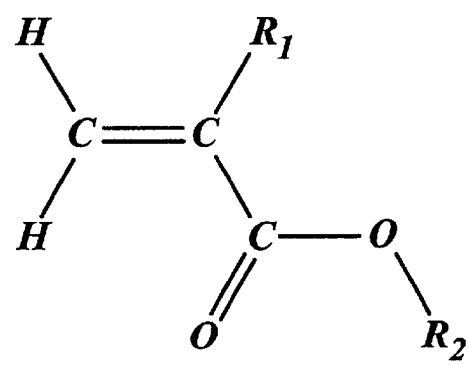
FIG. 1b is a chemical diagram of (meth)acrylate.
Figure 1C:
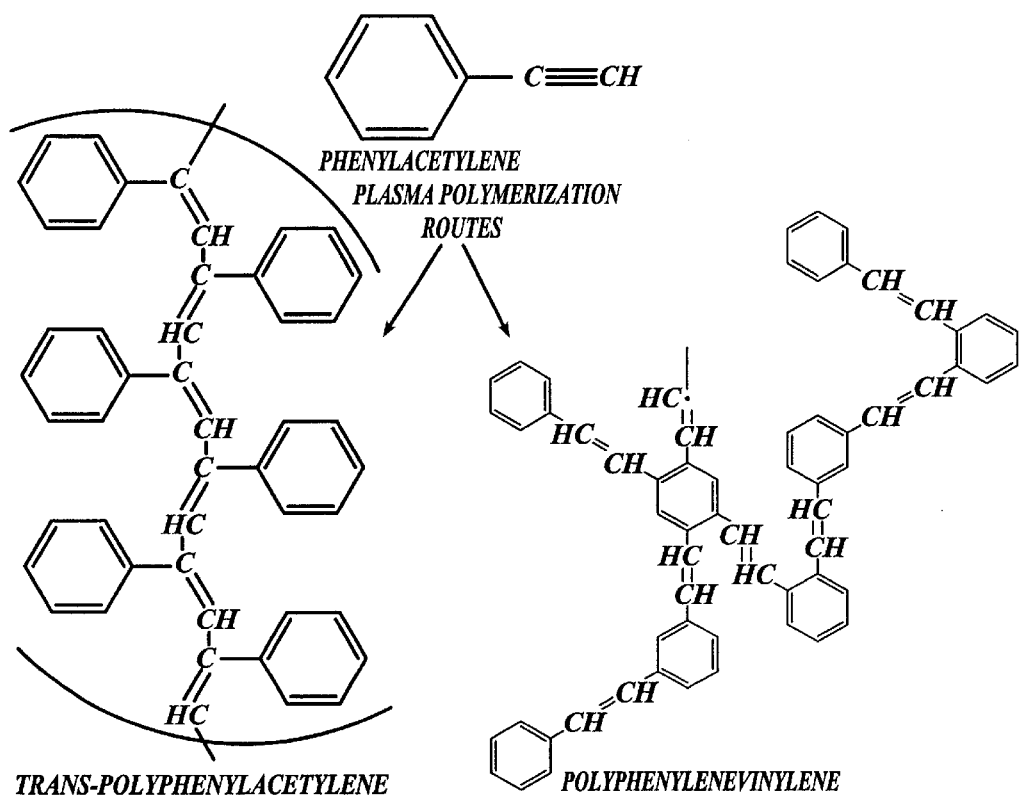
FIG. 1c is a chemical diagram of phenylacetylene.
Figure 1D:
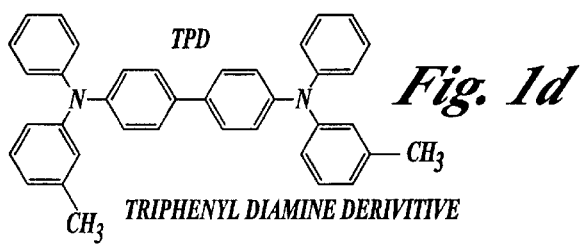
FIG. 1d is a chemical diagram of triphenyl diamine derivative.
Figure 1E:
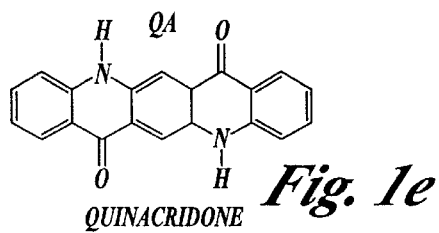
FIG. 1e is a chemical diagram of quinacridone.
Figure 1F:
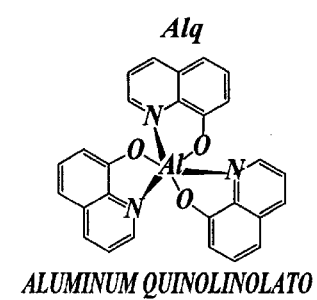
FIG. 1f is a chemical diagram of aluminum quinolinolato.

According to the present invention, the composite polymer may be made by mixing a liquid polymer precursor with molecular dopant forming a molecularly doped polymer precursor particle mixture, flash evaporating the molecularly doped polymer precursor mixture forming a composite vapor, and cryocondensing the composite vapor on a cool substrate forming a cryocondensed composite molecularly doped polymer precursor layer and cross linking the cryocondensed composite molecularly doped polymer precursor layer thereby forming a layer of the composite polymer of the molecularly doped polymer.

The flash evaporating may be performed by supplying a continuous liquid flow of the molecularly doped polymer precursor mixture into a vacuum environment at a temperature below both the decomposition temperature and the polymerization temperature of the molecularly doped polymer precursor mixture, continuously atomizing the molecularly doped polymer precursor mixture into a continuous flow of droplets, and continuously vaporizing the droplets by continuously contacting the droplets on a heated surface having a temperature at or above a boiling point of the liquid polymer precursor and of the molecular dopant, but below a pyrolysis temperature, forming the composite vapor. The droplets typically range in size from about 1 micrometer to about 50 micrometers, but they could be smaller or larger.

Alternatively, the flash evaporating may be performed by supplying a continuous liquid flow of the polymer precursor mixture into a vacuum environment at a temperature below both the decomposition temperature and the polymerization temperature of the polymer precursor mixture, and continuously directly vaporizing the liquid flow of the polymer precursor mixture by continuously contacting the liquid polymer precursor mixture on a heated surface having a temperature at or above the boiling point of the liquid polymer precursor, but below the pyrolysis temperature, forming the evaporate. This may be done using the vaporizer disclosed in U.S. Pat. Nos. 5,402,314, 5,536,323, and 5,711,816, which are incorporated herein by reference.

The molecular dopant molecules can be introduced to the polymer precursor as particles or as a solution of small molecules. During flash evaporation, both the polymer precursor and the molecular dopant are vaporized. As a result of this vaporization, the molecular dopant molecules are dispersed among the polymer precursor molecules. Upon condensation or cryocondensation, a composite is formed in which the molecular dopant is distributed within the composite at a molecular level. In other words, the molecular dopant is dispersed in a polymeric matrix.

The molecular dopant should be sufficiently small with respect to particle density and liquid polymer precursor density and viscosity that the settling rate of the molecular dopant within the liquid polymer precursor is several times greater than the amount of time to transport a portion of the liquid molecularly doped polymer precursor mixture from a reservoir to the atomization nozzle. The molecularly doped polymer precursor mixture may need to be agitated in the reservoir to maintain suspension of the molecular dopant and avoid settling. As used herein, agitation includes, but is not limited to, stirring, physical shaking, ultrasonic vibration, and convection (thermal gradient).

If an atomizer is used, upon spraying, the droplets may include molecular dopant alone, molecular dopant surrounded by liquid polymer precursor, or liquid polymer precursor alone. Since both the liquid polymer precursor and the molecular dopant are evaporated, it makes no difference. The droplets should be sufficiently small that they are completely vaporized. Although larger or smaller droplets may also be used, the droplet size is typically in the range of from about 1 micrometer to about 50 micrometers,.

After condensation, the cross linking may be by any standard curing technique, including, but not limited to, radiation curing, including ultraviolet and electron beam, glow discharge ionization, and spontaneous thermal induced curing. In radiation curing (FIG. 1), the polymer precursor liquid may include a photoinitiator. In glow discharge ionization curing, a combined flash evaporator, glow discharge plasma generator is used without either an electron beam gun or ultraviolet light.

The mixture of polymer precursor and molecular dopant may be considered a solution, slurry, suspension, or emulsion, and the molecular dopant may be solid or liquid. The mixture may be obtained by several methods. One method is to mix molecular dopant of a specified size into the polymer precursor. The molecular dopant of a solid of a specified size may be obtained by direct purchase or by making it by one of any standard techniques, including, but not limited to, milling from large particles, precipitation from solution, melting/spraying under controlled atmospheres, or rapid thermal decomposition of precursors from solution as described in U.S. Pat. No. 5,652,192 (the '192 patent) which is incorporated herein by reference. The process described in the '192 patent involves making a solution of a soluble precursor in a solvent and flowing the solution through a reaction vessel, pressurizing and heating the flowing solution and forming substantially insoluble particles, then quenching the heated flowing solution and arresting growth of the particles. Alternatively, larger sizes of solid material may be mixed into liquid polymer precursor and then agitated, for example ultrasonically, to break the solid material into particles of an appropriate size.

The liquid polymer precursor may be any liquid polymer precursor useful in flash evaporation for making polymer films. The polymer precursors may be monomers, oligomers, or resins, and combinations thereof. Examples of monomers include, but are not limited to, (meth)acrylate molecules, for example, hexanedioldiacrylate, and is tetraethyleneglycoldiacrylate, styrene, and methyl styrene, and combinations thereof. Oligomers, include, but are not limited to, polyethylene glycol diacrylate 200, polyethylene glycol diacrylate 400, and polyethylene glycol diacrylate 600, tripropyleneglycol diacrylate, tetraethylene glycol diacrylate, tripropylene glycol monoacrylate, and caprolactone acrylate, and combinations thereof. Resins include, but are not limited to, polystyrene resins, epoxy polyamine resins, phenolic resins, and (meth)acrylic resins, and combinations thereof The (meth)acrylate polymer precursors are particularly useful in making light emitting polymers (LEP).

The liquid polymer precursor may have a low vapor pressure at ambient temperatures so that it will readily cryocondense. The vapor pressure of the liquid polymer precursor material may be less than about 10 torr at 83° F. (28.3° C.), less than about 1 torr at 83° F. (28.3° C.), or less than about 10 millitorr at 83° F. (28.3° C.)

The molecular dopant may be soluble, insoluble, or partially soluble in the polymer precursor and have a boiling point below a temperature of the heated surface in the flash evaporation process. Molecular dopants include, but are not limited to, light emitting molecular dopants and charge transporting molecular dopants. Soluble molecular dopants dissolve in the polymer precursor to form a homogeneous mixture which is capable of vaporization, and atomization if desired. Examples of soluble molecular dopants include, but are not limited to, substituted metal tris(N-R 8-quinolinolato) chelates, wherein N is between 2 and 7 and is the substituent position of the ligand, and wherein R is H, alkyl, alkoxy, and fluorinated hydrocarbons; and substituted tertiary aromatic amines, such as, for example:

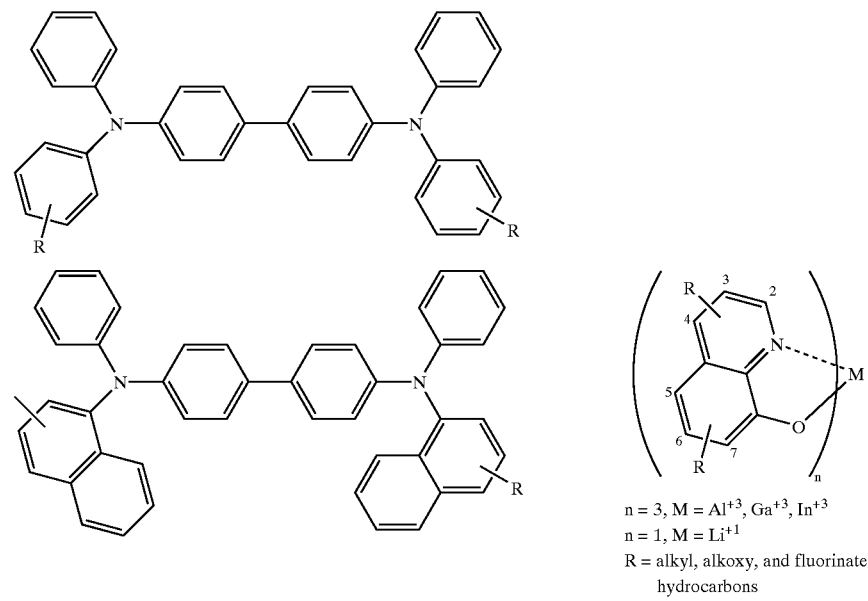

-continued

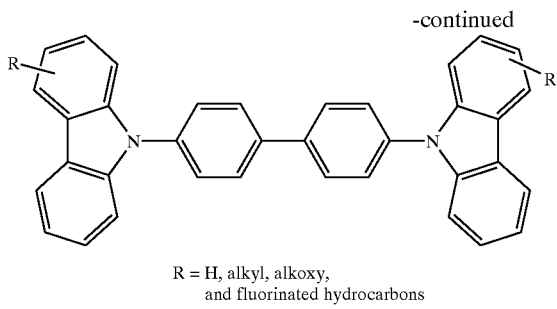

R = H, alkyl, alkoxy,
and fluorinated hydrocarbons

Solubilized Hole
Transport Layer Materials

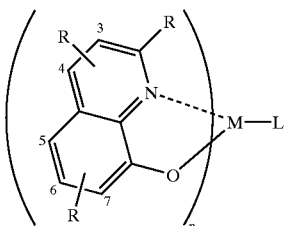

M = Al$^{+3}$, Ga$^{+3}$, In$^{+3}$
R = alkyl, alkoxy, and fluorinated
hydrocarbons
L = monodentate ligand, such as
carboxylate, phenolate and derivati Solubilized Electron
Transport Layer Materials Insoluble molecular dopants do not dissolve in the polymer precursor. They form a heterogeneous mixture which is capable of vaporization and atomization (if desired). Insoluble molecular dopants include, but are not limited to: tertiary aromatic amines, such as triphenyl diamine derivatives (TPD, FIG. 1d); quinacridone derivatives (QA, FIG. 1e); and metal (8-quinolinolato) chelates, such as aluminum quinolinolato (Alq, FIG. 1f), gallium quinolinolato (Gaq), and lithium quinolinolato (Liq); and combinations thereof. Partially soluble means that some of the molecular dopant does not dissolve in the polymer precursor, including the situation in which a soluble molecular dopant is present in a concentration exceeding the solubility limit in the polymer precursor so that some of the dissolvable material remains undissolved.

To achieve a molecularly doped composite, the molecular dopant may be incorporated on a molecular level within the matrix as a molecularly doped polymer (MDP) or may be multi-molecule particle clusters distributed within the matrix. When the molecular dopant is a charge transporting molecular dopant, it would typically be soluble in the polymer precursor.

Figure 2:
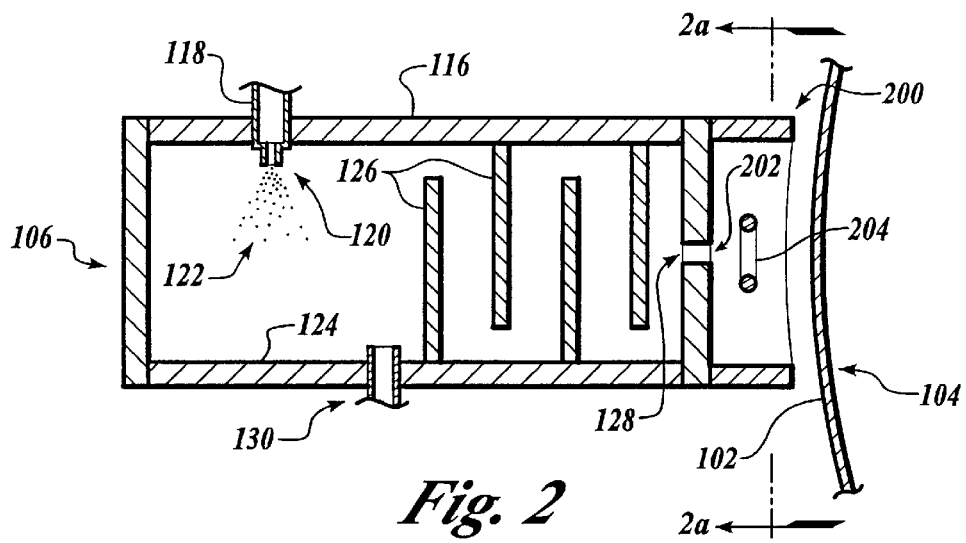
FIG. 2 is a cross section of an apparatus for combined flash evaporation and glow discharge plasma deposition which may be used in the present invention.
Figure 2A:
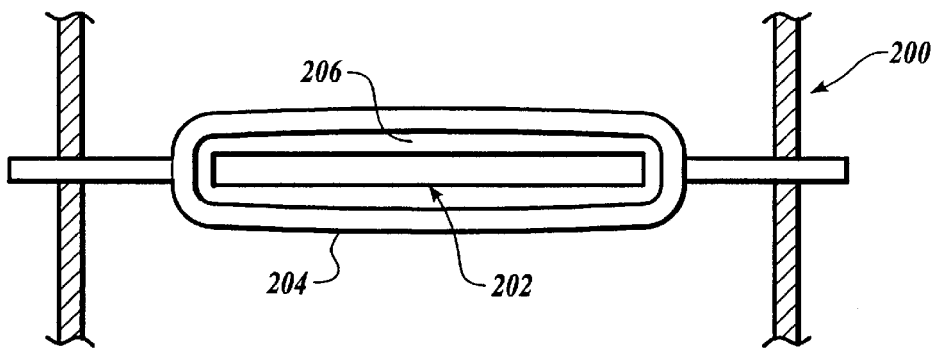
FIG. 2a is a cross section end view of an apparatus which may be used in the present invention.
Figure 3:
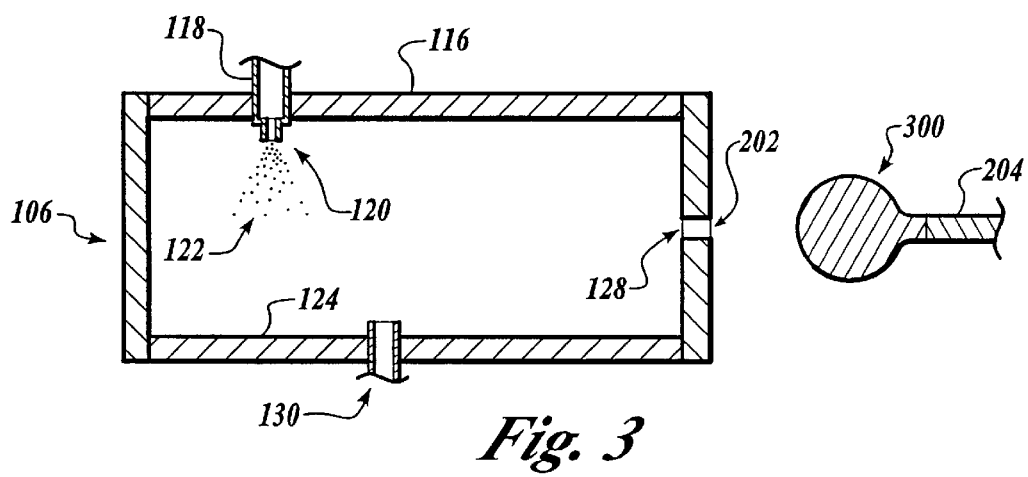
FIG. 3 is a cross section of the present invention wherein the substrate is the electrode.

FIG. 2 illustrates an apparatus which can be used to make a composite polymer of a molecularly doped polymer. The process may be performed within a low pressure (vacuum) environment or chamber. Pressures typically range from about $10^{-1}$ torr to $10^{-6}$ torr, although higher or lower pressures may be used. The flash evaporator 106 has a housing 116, with a polymer precursor inlet 118 and an atomizing nozzle 120. Flow through the nozzle 120 is atomized into droplets 122 which strike the heated surface 124 whereupon the droplets 122 are flash evaporated into a gas or evaporate that flows past a series of baffles 126 to an evaporate outlet 128 and cryocondenses on the surface 102. Cryocondensation on the baffles 126 and other internal surfaces is prevented by heating the baffles 126 and other surfaces to a temperature in excess of a cryocondensation temperature or dew point of the evaporate. Although other gas flow distribution arrangements have been used, it has been found that the baffles 126 provide adequate gas flow distribution or uniformity while permitting ease of scaling up to large surfaces 102. Crosslinking may be by radiation, including ultraviolet, electron beam, and x-ray, glow discharge ionization, and spontaneous thermal induced curing In another embodiment, the evaporate outlet 128 directs gas toward a glow discharge electrode 204 creating a glow discharge plasma from the evaporate. In the embodiment shown in FIG. 2, the glow discharge electrode 204 is placed in a glow discharge housing 200 having an evaporate inlet 202 proximate the evaporate outlet 128. In this embodiment, the glow discharge housing 200 and the glow discharge electrode 204 are maintained at a temperature above a dew point of the evaporate. The glow discharge plasma exits the glow discharge housing 200 and cryocondenses on the surface 102 of the substrate 104.

In either embodiment, the substrate 104 should be kept at a temperature below a dew point of the evaporate, preferably ambient temperature or cooled below ambient temperature to enhance the cryocondensation rate. In these embodiments, the substrate 104 is moving and may be electrically grounded, electrically floating, or electrically biased.

Where glow discharge is used, and if the substrate 104 is electrically biased, it may even replace the electrode 204 and be, itself, the electrode which creates the glow discharge plasma from the monomer gas, as described in application Ser. No. 08/939,594, entitled "Plasma Enhanced Chemical Deposition with Low Vapor Pressure Compounds," filed Sep. 29, 1997, which is incorporated herein by reference.

In operation, either as a method for plasma enhanced chemical vapor deposition of low vapor pressure materials (coating material) onto a surface, or as a method for making polymer layers (especially PML), the method of the invention includes flash evaporating a molecularly doped polymer precursor forming a composite vapor, cryocondensing the composite vapor onto a surface, and crosslinking the cryocondensed composite molecularly doped polymer precursor layer. The crosslinking may be by radiation, for example electron beam, ultraviolet, or x-ray, glow discharge ionization, or spontaneous thermal induced curing.

The flash evaporating can include flowing the molecularly doped polymer precursor mixture to an inlet, atomizing the material through a nozzle and creating a plurality of molecularly doped polymer precursor mixture droplets as a spray. The spray is directed onto a heated evaporation surface whereupon it is evaporated and discharged through an evaporate outlet.

The molecularly doped polymer precursor may be directly vaporized without atomization if an apparatus such as is described in U.S. Pat. Nos. 5,204,314, 5,536,323, and 5,711,816 is used.

By using flash evaporation (whatever the exact method), the polymer precursor is vaporized so quickly that reactions which generally occur from heating a liquid material to an evaporation temperature simply do not occur. Further, the rate of evaporate delivery is strictly controlled by the rate of material delivery to the inlet 118 of the flash evaporator 106.

Multiple layers of materials may be combined using the present invention. For example, as recited in U.S. Pat. Nos. 5,547,508, 5,395,644, and 5,260,095, hereby incorporated by reference, multiple polymer layers, alternating layers of polymer and metal, and other layers may be made with the present invention in the vacuum environment.

Organic optoelectronic devices may be made using this process. Organic optoelectronic devices are organic based devices that use: 1) light and electrons for transmitting, processing, and storing signals that carry any kind of information; 2) electrons for creating and modulating light (emission, fluorescence, etc.); and 3) light to create electric currents and electronic signals. Examples of organic optoelectronic devices include, but are not limited to, organic light emitting devices, liquid crystal displays, photo diodes, light modulators for telecommunications, wave guides, solar cells, and integrated optics.

The organic optoelectronic device can include one or more layers of crosslinked molecularly doped polymer, including, but not limited to, the hole transport layer, the active layer, and the electron transport layer. The organic optoelectronic device can include a first electrode, a hole transport layer, an active layer, an electron transport layer, and a second electrode. The organic optoelectronic device can optionally include a charge injection layer, and a hole blocking layer. The first electrode may be a transparent conductive oxide, and the second electrode may be a metal cathode.

Active layers include, but are not limited to, light emitting layers, light absorbing layers, and electric current generating layers.

When the hole transport layer is the molecularly doped polymer layer, the molecular dopant includes, but is not limited to, tertiary aromatic amines. When the active layer is the molecularly doped polymer layer, the molecular dopant includes, but is not limited to, metal (8-quinolinolato) chelates, quinacridone derivatives, and triaryl amine derivatives. When the electron transport layer is the molecularly doped polymer layer, the molecular dopant includes, but is not limited to, metal (8-quinolinolato) chelates.

The organic optoelectronic device can be made by depositing a first electrode adjacent a substrate, depositing a hole transport layer adjacent the first electrode, depositing an active layer adjacent the hole transport layer, depositing an electron transport layer adjacent the active layer, and depositing a second electrode adjacent the electron transport layer. Optionally, a charge injection layer can be deposited adjacent to the first electrode before the hole injection layer is deposited, and/or a hole blocking layer can be deposited adjacent to the electron transport layer before the second electrode is deposited. By adjacent, we mean next to, but not necessarily directly next to. There can be additional layers intervening between the adjacent layers. The crosslinked molecularly doped polymer layers include, but are not limited to, the hole transport layer, the active layer, and the electron transport layer.

The molecularly doped polymer layer can be made by the process described above. Other layers can be made by any suitable deposition processes, which include both vacuum processes and atmospheric processes. Suitable processes, include, but are not limited to, reactive magnetron sputtering for depositing the transparent conductive oxide, electron beam evaporation or magnetron sputtering for depositing the charge injection layer, reactive magnetron sputtering for depositing the hole blocking layer, and electron beam evaporation or magnetron sputtering for the metal cathode.

When plasma curing is used, the present invention is insensitive to a direction of motion of the substrate because the deposited polymer precursor layer is self curing.

The present invention allows the conjugation (if any) to be preserved during curing using any of the curing methods.

During flash evaporation, both the polymer precursor and the molecular dopant are vaporized. As a result of this vaporization, the molecular dopant is dispersed in a polymeric matrix. More specifically, the molecular dopant is dispersed among the polymer precursor molecules. After the dispersion, condensation or cryocondensation occurs. The composite is formed when the molecular dopant is distributed within the composite at a molecular level.

EXAMPLE I

An experiment was conducted to demonstrate the method of the present invention. The polymer precursor was TRPGDA (tn-propylene glycol diacrylate). Several starting conditions were used as indicated in Table E1-1.

TABLE E1-1

| | Starting Materials and Amounts | | | |
|---|---|---|---|---|
| | Sample 1 | Sample 2 | Sample 3[A] | Sample 4 |
| Monomer | TRPGDA | TRPGDA | TRPGDA | TRPGDA |
| TPD (vol %) | 10 | 0 | 10 | 0 |
| Alq (vol %) | 0 | 10 | 10 | 0 |
| QA | 0 | 0 | 0 | 10 |

[A]includes 2 vol % lithium-trifluoromethanesulfonate ($CF_3SO_3Li$)

The molecularly doped polymer precursor mixture was flash evaporated under a vacuum of $10^{-4}$ torr and condensed upon a substrate of PET moving at a rate between 0–100 ft/mm. Curing was by UV, electron beam, and glow discharge ionization by exposure of the evaporate to a plasma prior to condensation. See J. D. Affinito et al., "Molecularly Doped Polymer Composite Films for Light-Emitting Polymer Applications Fabricated by the PML Process," Proceedings of the 41st Annual Technical Conference of the Society of Vacuum Coaters (1998), p. 220–225.

While certain representative embodiments and details have been shown for purposes of illustrating the invention, it will be apparent to those skilled in the art that various changes in the compositions and methods disclosed herein may be made without departing from the scope of the invention, which is defined in the appended claims.

What is claimed is:

1. A method of making a composite polymer of a molecularly doped polymer comprising:

mixing a liquid polymer precursor with molecular dopant forming a molecularly doped polymer precursor mixture;

flash evaporating the molecularly doped polymer precursor mixture forming a composite vapor; and cryocondensing the composite vapor on a cool substrate forming a cryocondensed composite molecularly doped polymer precursor layer and cross linking the cryocondensed composite molecularly doped polymer precursor layer thereby forming a layer of the composite polymer of the molecularly doped polymer.

2. The method as recited in claim 1, wherein flash evaporating comprises:

supplying a continuous liquid flow of the molecularly doped polymer precursor mixture into a vacuum environment at a temperature below both the decomposition temperature and the polymerization temperature of the molecularly doped polymer precursor mixture;

continuously atomizing the molecularly doped polymer precursor mixture into a continuous flow of droplets; and continuously vaporizing the droplets by continuously contacting the droplets on a heated surface having a temperature at or above a boiling point of the liquid polymer precursor and of the molecular dopant, but below a pyrolysis temperature, forming the composite vapor.

3. The method as recited in claim 2 wherein the molecular dopant has a boiling point below a temperature of the heated surface.

4. The method as recited in claim 2 wherein the droplets are selected from the group consisting of molecular dopant alone, molecular dopant surrounded by liquid polymer precursor, or liquid polymer precursor alone.

5. The method as recited in claim 2 wherein the droplets range in size from about 1 micrometer to about 50 micrometers.

6. The method as recited in claim 1 wherein flash evaporating comprises:

supplying a continuous liquid flow of the molecularly doped polymer precursor mixture into a vacuum environment at a temperature below both the decomposition temperature and the polymerization temperature of the molecularly doped polymer precursor mixture; and continuously directly vaporizing the liquid flow of the molecularly doped polymer precursor mixture by continuously contacting the molecularly doped polymer precursor mixture on a heated surface having a temperature at or above a boiling point of the liquid polymer precursor and of the molecular dopant, but below a pyrolysis temperature, forming the composite vapor.

7. The method as recited in claim 1 wherein the molecular dopant is selected from be the group consisting of light emitting molecular dopants, and charge transporting molecular dopants, and combinations thereof.

8. The method as recited in claim 1 wherein the molecular dopant is selected from the group consisting of molecular dopant which is soluble in the polymer precursor, molecular dopant which is insoluble in the polymer precursor, and molecular dopant which is partially soluble in the polymer precursor, and combinations thereof.

9. The method as recited in claim 1, wherein the molecular dopant is selected from the group consisting of organic solids, and organic liquids, and combinations thereof.

10. The method as recited in claim 9 wherein the molecular dopant is an organic solid selected from the group consisting of metal 8-quinolinolato chelates, triaryl amine derivatives, and quinacridone derivatives, and combinations thereof.

11. The method as recited in claim 8, wherein the molecular dopant is soluble in the polymer precursor and wherein the molecular dopant is selected from the group consisting of metal tris (N-R 8-quinolinolato) chelates, wherein N is the substituent position and is between 2 and 7, and wherein R is H, an alkyl group, an alkoxy group, or a fluorinated hydrocarbon group; and substituted tertiary aromatic nines; and combinations thereof.

12. The method as recited in claim 1 wherein the molecular dopant is sufficiently small that the settling rate of the molecular dopant within the liquid molecularly doped polymer precursor mixture is several times greater than the amount of time to transport a portion of the liquid molecularly doped polymer precursor mixture from a reservoir to an atomization nozzle.

13. The method as recited in claim 1 further comprising agitating the liquid molecularly doped polymer precursor mixture.

14. The method as recited in claim 1, wherein the polymer precursor is selected from the group consisting of(meth) acrylate polymer precursors, styrene polymer precursors, methyl styrene polymer precursors, epoxy polyamine polymer precursors, and phenolic polymer precursors, and combinations thereof.

15. The method as recited in claim 14, wherein the polymer precursor is a (meth)acrylate polymer precursors selected from the group consisting of polyethylene glycol diacrylate 200, polyethylene glycol diacrylate 400, polyethylene glycol diacrylate 600, tripropyleneglycol diacrylate, tetraethylene glycol diacrylate, tripropylene glycol monoacrylate, and caprolactone acrylate, and combinations thereof.

16. The method as recited in claim 1, wherein the cross linking is selected from the group consisting of radiation cross linking, ultraviolet cross linking, x-ray cross linking, electron beam cross linking, glow discharge ionization cross linking, and spontaneous thermally induced cross linking.

17. The method as recited in claim 1, further comprising passing the composite vapor past a glow discharge electrode prior to cryocondensing.

* * * * *

UNITED STATES PATENT AND TRADEMARK OFFICE
CERTIFICATE OF CORRECTION

PATENT NO. : 6,613,395 B2
DATED : September 2, 2003
INVENTOR(S) : Affinito et al.

It is certified that error appears in the above-identified patent and that said Letters Patent is hereby corrected as shown below:

Column 3,
Line 23, "weights on the order of 1 dalton," should be -- weights on the order of $10^5$ dalton, --

Column 8,
Line 9, "hexanedioldiacrylate, and is" should be -- hexanedioldiacrylate and --
Line 26, "(28.3ºC)" should be -- (28.3ºC), if desired. --

Column 10,
"n" should be -- 2 -- (as shown)

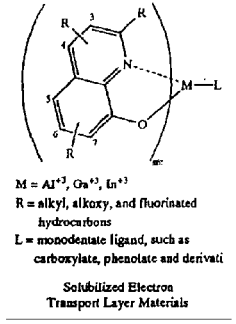

Column 13,
Line 40, "is selected from be the" should be -- is selected from the --

Column 14,
Line 14, "substituted tertiary aromatic nines" should be -- substituted tertiary aromatic amines --

Signed and Sealed this

Twentieth Day of July, 2004

JON W. DUDAS
*Acting Director of the United States Patent and Trademark Office*